(12) United States Patent
Cheng et al.

(10) Patent No.: US 9,543,302 B2
(45) Date of Patent: Jan. 10, 2017

(54) FORMING IV FINS AND III-V FINS ON INSULATOR

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/992,050

(22) Filed: Jan. 11, 2016

(65) Prior Publication Data

US 2016/0126244 A1     May 5, 2016

Related U.S. Application Data

(62) Division of application No. 14/499,395, filed on Sep. 29, 2014, now Pat. No. 9,299,787.

(51) Int. Cl.
| | |
|---|---|
| *H01L 27/092* | (2006.01) |
| *H01L 29/786* | (2006.01) |
| *H01L 29/06* | (2006.01) |
| *H01L 29/10* | (2006.01) |
| *H01L 29/20* | (2006.01) |
| *H01L 29/16* | (2006.01) |
| *H01L 21/3115* | (2006.01) |
| *H01L 21/311* | (2006.01) |

(52) U.S. Cl.
CPC ...... *H01L 27/0924* (2013.01); *H01L 21/31111* (2013.01); *H01L 21/31155* (2013.01); *H01L 29/0649* (2013.01); *H01L 29/1054* (2013.01); *H01L 29/16* (2013.01); *H01L 29/20* (2013.01); *H01L 29/78681* (2013.01); *H01L 29/78684* (2013.01); *H01L 29/78696* (2013.01)

(58) Field of Classification Search
CPC ...... H01L 29/1054; H01L 29/16; H01L 29/20; H01L 29/0649; H01L 29/78681; H01L 29/78684; H01L 29/78696; H01L 21/31111; H01L 21/31155; H01L 27/0924
See application file for complete search history.

(56) References Cited

U.S. PATENT DOCUMENTS

| | | | |
|---|---|---|---|
| 8,716,797 | B2 | 5/2014 | Basker et al. |
| 9,123,585 | B1 | 9/2015 | Czornomaz et al. |
| 2011/0068407 | A1 | 3/2011 | Yeh et al. |
| 2012/0068264 | A1 | 3/2012 | Cheng et al. |
| 2013/0099283 | A1 | 4/2013 | Lin et al. |

(Continued)

OTHER PUBLICATIONS

Pending U.S. Appl. No. 14/499,395, titled "Forming IV Fins and III-V Fins on Insulator," filed Sep. 29, 2014, pp. 1-24.

*Primary Examiner* — Whitney T Moore
(74) *Attorney, Agent, or Firm* — Andrew G. Wakim

(57) ABSTRACT

A semiconductor structure including: a set of first fins in a pFET region and a set of second fins in an nFET region, the first fins and the second fins are on a buried insulator layer, the first fins have a bottom surface coplanar with a bottom surface of the second fins, the first fins have a first pitch between adjacent first fins that is equal to a second pitch between adjacent second fins, the first fins include a group IV semiconductor material, the second fins include a group III-V semiconductor material.

6 Claims, 6 Drawing Sheets

(56) References Cited

U.S. PATENT DOCUMENTS

| | | |
|---|---|---|
| 2013/0161756 A1 | 6/2013 | Glass et al. |
| 2013/0196488 A1 | 8/2013 | Hekmatshoartabari et al. |
| 2013/0228864 A1 | 9/2013 | Mieno |
| 2013/0256799 A1 | 10/2013 | Wu et al. |
| 2013/0309847 A1 | 11/2013 | Maszara et al. |
| 2013/0320294 A1 | 12/2013 | Cappellani et al. |
| 2013/0330916 A1 | 12/2013 | Pham et al. |

… # FORMING IV FINS AND III-V FINS ON INSULATOR

CROSS-REFERENCE

The present application is a divisional of, and claims priority under 35 U.S.C. §120, U.S. patent application Ser. No. 14/499,395, filed on Sep. 29, 2014, which is incorporated by reference in its entirety.

BACKGROUND

The present invention generally relates to semiconductor device manufacturing, and more particularly to a III-V fin and a IV fin having a similar fin pitch on a shared surface.

The downscaling of the physical dimensions of metal oxide semiconductor field effect transistors (MOSFETs) has led to performance improvements of integrated circuits and an increase in the number of transistors per chip. Multiple gate MOSFET structures, such as fin field effect transistor's (finFETs) and tri-gate structures, have been proposed as promising candidates for 14 nm technology nodes and beyond. In addition, high-mobility channel materials, such as III-V and germanium, have been proposed as technology boosters to further improve MOSFET scaling improvements.

Integration of lattice mismatched semiconductor materials is one path to high performance semiconductor devices such as complementary metal-oxide-semiconductor (CMOS) field-effect transistors (FET) due to their high carrier mobility. For example, the heterointegration of lattice mismatched semiconductor materials with silicon will be useful for a wide variety of device applications. However, disadvantages associated with structural characteristics of lattice mismatched devices can decrease device performance, require additional processes or design constraints to counter-effect such structural characteristics or reduce manufacturing yield.

SUMMARY

According to an embodiment of the present invention, a structure is provided. The structure may include a set of first fins in a pFET region and a set of second fins in an nFET region, the first fins and the second fins are on a buried insulator layer, the first fins have a bottom surface coplanar with a bottom surface of the second fins, the first fins have a first pitch between adjacent first fins that is equal to a second pitch between adjacent second fins, the first fins include a group IV semiconductor material, the second fins include a group III-V semiconductor material.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
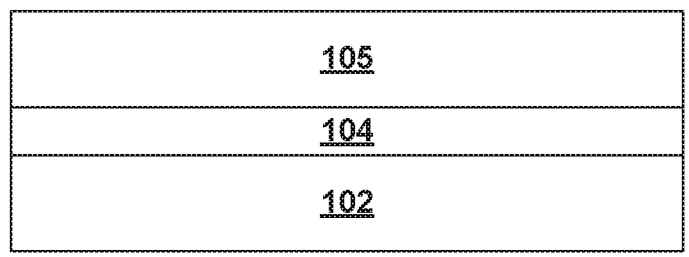
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the fabrication of III-V fins and IV fins having a similar fin pitch and on a shared surface. Ideally, it may be desirable to form III-V fins and IV fins having a similar fin pitch and on a shared surface without the need for long epitaxial growth times and with low levels of defects. The purpose of forming III-V fins and IV fins having a similar fin pitch and on a shared surface may be to allow circuit designers to follow the design rule, as is known in the art.

One way to form III-V fins and IV fins having a similar fin pitch and on a shared surface is to form the IV fins in a pFET region and an nFET region, form a spacer layer on the IV fins, remove the spacer layer from a top surface and a side surface of the IV fins in the nFET region, form the III-V fins on the top surface and the side surface of the IV fins in the nFET region, remove the IV fins from the nFET region, and remove the spacer layer from both the pFET and nFET regions. One embodiment by which to form III-V fins and IV fins having a similar fin pitch and on a shared surface is described in detail below with reference to the accompanying drawings FIGS. 1-11. It should be noted, the present embodiment utilizes the III-V group and IV group semiconductors but other materials may be used. Additionally, IV fins may be referred to as first fins and the III-V fins may be referred to as second fins.

Figure 2:
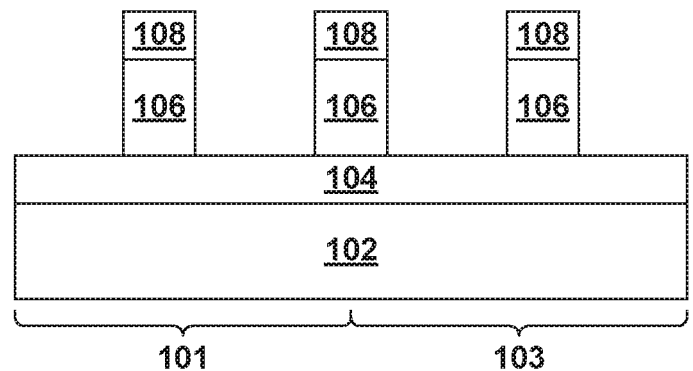
FIG. 2 is a cross section view of the semiconductor structure and illustrates the formation of mandrels.

Referring now to FIGS. 1 and 2, demonstrative illustrations of a structure 100 during an intermediate step of a method of fabricating III-V fins and IV fins having a similar fin pitch and on a shared surface are provided, according to an exemplary embodiment. More specifically, the method can start with fabricating mandrels 106 in a substrate.

The substrate may be any substrate known in the art, such as, for example, a semiconductor-on-insulator (SOI) substrate or a bulk substrate. In an embodiment, an SOI substrate is used. The SOI substrate includes a semiconductor layer 105, a buried insulator layer 104, and a base substrate 102. The semiconductor layer 105 is on the buried insulator layer 104 and the buried insulator layer 104 is on the base substrate 102. The SOI substrate may be formed using any technique known in the art, such as, for example, Separation by Ion Implantation of Oxygen (SIMOX) or a layer transfer process. When a layer transfer process is employed, an optional thinning step may follow the bonding of two semiconductor wafers together. The optional thinning step can reduce the thickness of a layer to a desirable thickness. In an alternative embodiment, if a bulk substrate is used, an insulating material (e.g., oxide) may be used to electrically isolate subsequently formed components (e.g., fins).

In some embodiments, the base substrate 102 and the semiconductor layer 105 may include a same or similar semiconductor material. In other embodiments, the base substrate 102 and the semiconductor layer 105 may include a different material. The term "semiconductor material" as used herein may denote any semiconducting material including, for example, silicon (Si), germanium (Ge), silicon-germanium (SiGe) or other semiconductors. Multi-layers of semiconductor materials can also be used for the base substrate 102 and/or the semiconductor layer 105. In an embodiment, both the base substrate 102 and the semiconductor layer 105 include silicon. In another embodiment, the base substrate 102 is a non-semiconductor material, such as, for example, a dielectric material and/or a conductive material.

The base substrate 102 and the semiconductor layer 105 may have similar or may have different crystal orientations. For example, the crystal orientation of the base substrate 102 and/or the semiconductor layer 105 may be {100}, {110}, or {111}. Other crystallographic orientations besides those specifically mentioned can also be used. The base substrate 102 and/or the semiconductor layer 105 may be a single crystalline semiconductor material, a polycrystalline material, or an amorphous material. Typically, at least the semiconductor layer 105 is a single crystalline semiconductor material. In some embodiments, the semiconductor layer 105, located above the buried insulator layer 104, can be processed to include semiconductor regions having different crystal orientations.

The buried insulator layer 104 may be a crystalline or non-crystalline oxide or nitride. In an embodiment, the buried insulator layer 104 is an oxide, such as, for example, silicon dioxide. The buried insulator layer 104 may be continuous or discontinuous. The buried insulator layer 104 may typically have a thickness from about 1 nm to about 500 nm. In an embodiment, the buried insulator layer 104 may have a thickness ranging from about 10 nm to about 100 nm. In an alternative embodiment, the buried insulator layer 104 may include multiple dielectric layers or a stack of dielectric layers including a silicon oxide layer and/or a silicon nitride layer.

With reference to FIG. 2, the mandrels 106 may be formed in the semiconductor layer 105 using a hardmask 108. The hardmask 108 may be formed on the semiconductor layer 105 using any deposition technique known in the art, such as, for example, chemical vapor deposition, plasma enhanced chemical vapor deposition, atomic layer deposition, or physical vapor deposition. The hardmask 108 may include any masking material known in the art, such as, for example, silicon nitride ($Si_3N_4$), silicon carbide (SiC), silicon carbon nitride (SiCN), hydrogenated silicon carbide (SiCH), or any other masking material. In an embodiment, the hardmask 108 is a silicon nitride. A mandrel pattern may be formed in the hardmask 108 using any known patterning technique known in the art, such as, photolithography. The mandrels 106 may be formed by transferring the mandrel pattern into the semiconductor layer 105. The mandrel pattern may be transferred into the semiconductor layer 105 by etching the semiconductor layer 105 selective to the hardmask 108 and the buried insulator layer 104 (i.e., etching the semiconductor layer 105, where the hardmask 108 is a mask and the buried insulator layer 104 is an etch stop). There may be a mandrel pitch between any two adjacent mandrels. In an embodiment, a set of mandrels may be in a pFET region 101 and a set of mandrels may be in an nFET region 103. It should be noted, a "set" may refer to any number of mandrels 106, including a single mandrel. The mandrels 106 may have the same width as any adjacent mandrels.

Figure 3:
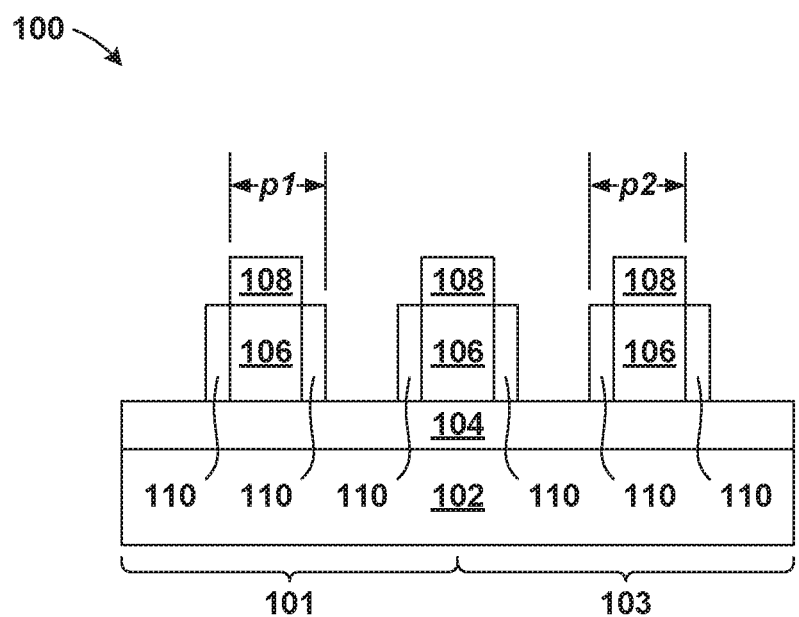
FIG. 3 is a cross section view of the semiconductor structure and illustrates the formation of IV fins on sidewalls of the mandrels.

Referring now to FIG. 3, a demonstrative illustration of a structure 100 during an intermediate step of a method of fabricating III-V fins and IV fins having a similar fin pitch and on a shared surface is provided, according to an exemplary embodiment. More specifically, the method can include growing IV fins 110 on sidewalls of the mandrels 106.

The IV fins 110 may be grown on the sidewalls of the mandrels 106 in the pFET and nFET regions 101, 103 using any formation technique known in the art, such as, for example, epitaxial growth. Epitaxy growth may be a layer of monocrystalline semiconductor material which grows outward from an exposed surface of an existing monocrystalline semiconductor region or layer. The epitaxial layer may have the same composition as the semiconductor region on which it is grown, the same impurities (e.g., dopants and their concentrations), or, alternatively, the compositions of the epitaxial layer and the underlying semiconductor region can be different. The IV fins 110 may have a thickness ranging from about 2 nm to about 10 nm. Defects may begin to occur in epitaxial growth if a critical thickness is exceeded, the critical thickness may range from about 2 nm to about 10 nm. In an embodiment, the IV fins 110 may be selectively grown on the sidewalls of the mandrels 106 and not on the hardmask 108 or the buried insulator layer 104, as illustrated. The IV fins 110 may be germanium and have a thickness of about 8 nm.

The IV fins 110 may be any material known in the art, such as, for example, germanium, silicon germanium, or other good pFET materials. In an embodiment, the IV fins 110 may be germanium. There may be a fin pitch between any two adjacent IV fins 110. A first pitch (p1) may be between adjacent IV fins 110 in the pFET region 101 and a second pitch (p2) may be between adjacent IV fins 110 in the nFET region 103. The first pitch (p1) may be the same as the second pitch (p2). In an embodiment, both the first pitch (p1) and the second pitch (p2) are equal to about 42 nm.

Figure 4:
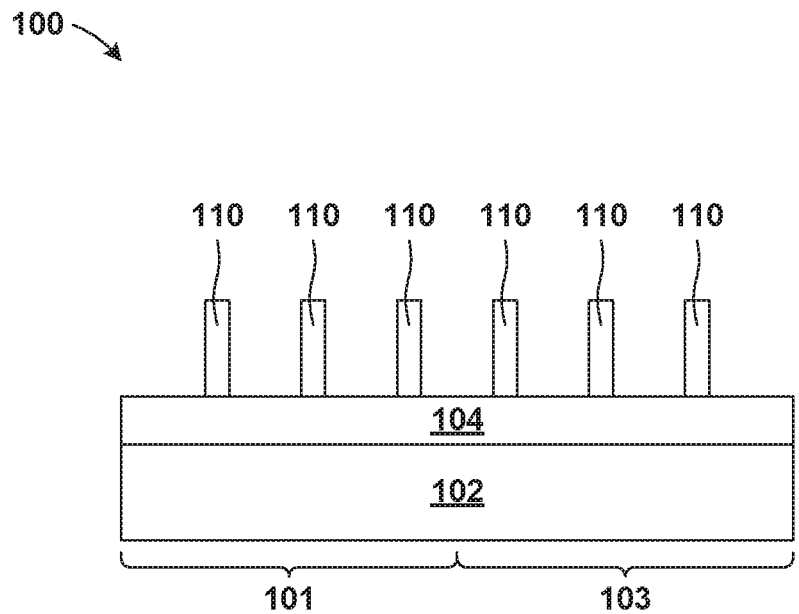
FIG. 4 is a cross section view of the semiconductor structure and illustrates the removal of the mandrels.

Referring now to FIG. 4, a demonstrative illustration of a structure 100 during an intermediate step of a method of fabricating III-V fins and IV fins having a similar fin pitch and on a shared surface is provided, according to an exemplary embodiment. More specifically, the method can include removing the hardmask 108 and the mandrels 106.

The hardmask 108 and the mandrels 106 may be removed using any mask removal technique as is known in the art, such as, for example, RIE. The etching technique used to remove the mandrels 106 may etch the mandrels 106 selective to the IV fins 110 and the buried insulator layer 104 (i.e., etching the mandrels 106 and using the IV fins 110 and the buried insulator layer 104 as an etch stop). An alternative method may include depositing a protective material on the buried insulator layer 104 and etching the mandrels 106 selective to the IV fins 110.

Figure 5:
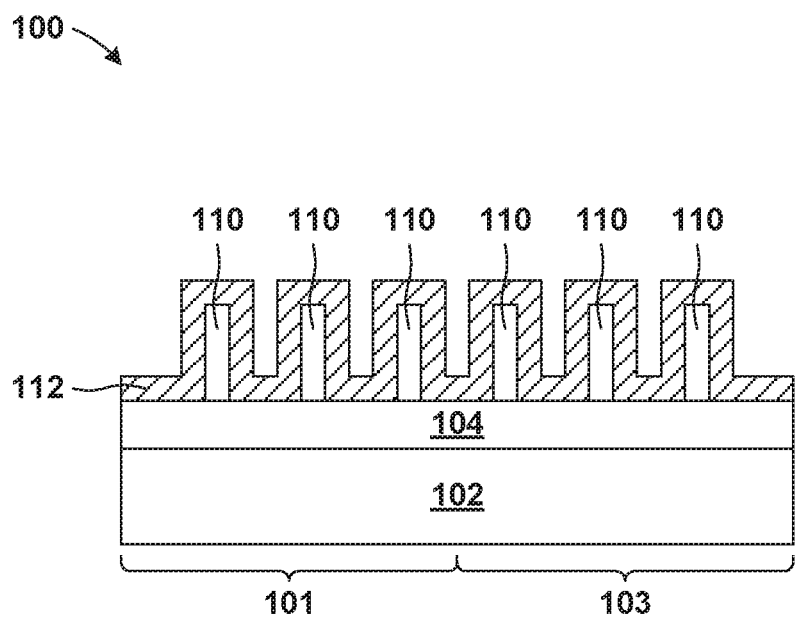
FIG. 5 is a cross section view of the semiconductor structure and illustrates the formation of a spacer layer on the IV fins.

Referring now to FIG. 5, a demonstrative illustration of a structure 100 during an intermediate step of a method of fabricating III-V fins and IV fins having a similar fin pitch and on a shared surface is provided, according to an exemplary embodiment. More specifically, the method can include forming a spacer layer 112 on the IV fins 110.

The spacer layer 112 may be conformally formed on the IV fins 110 using any deposition technique known in the art, such as, for example, chemical vapor deposition, plasma enhanced chemical vapor deposition, or atomic layer deposition. The spacer layer 112 may have a thickness ranging from about 2 nm to about 15 nm. The spacer layer 112 may be any spacer material known in the art, such as, for example, an oxide or a nitride.

Figure 6:
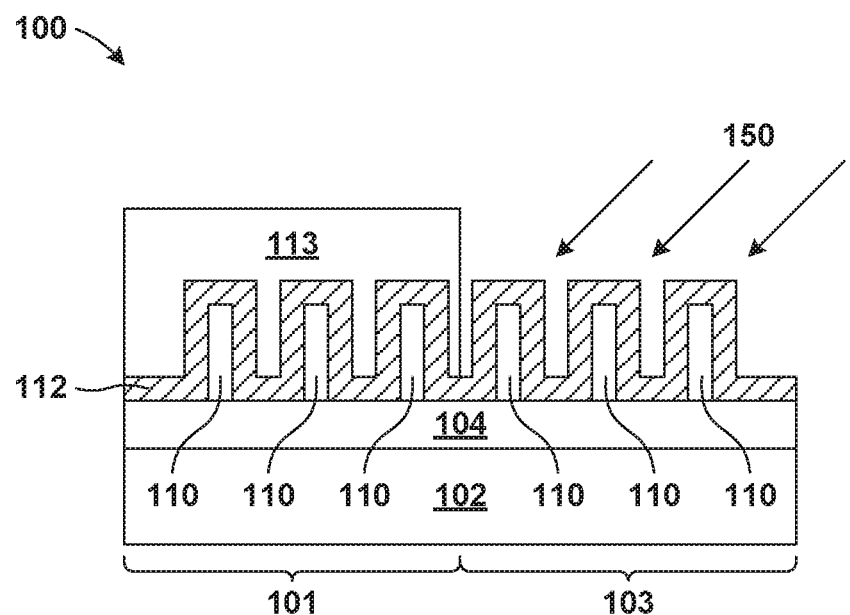
FIGS. 6 and 7 are cross section views of the semiconductor structure and illustrate the removal of the spacer layer from a top surface and a side surface of the IV fins in an nFET region.
Figure 7:
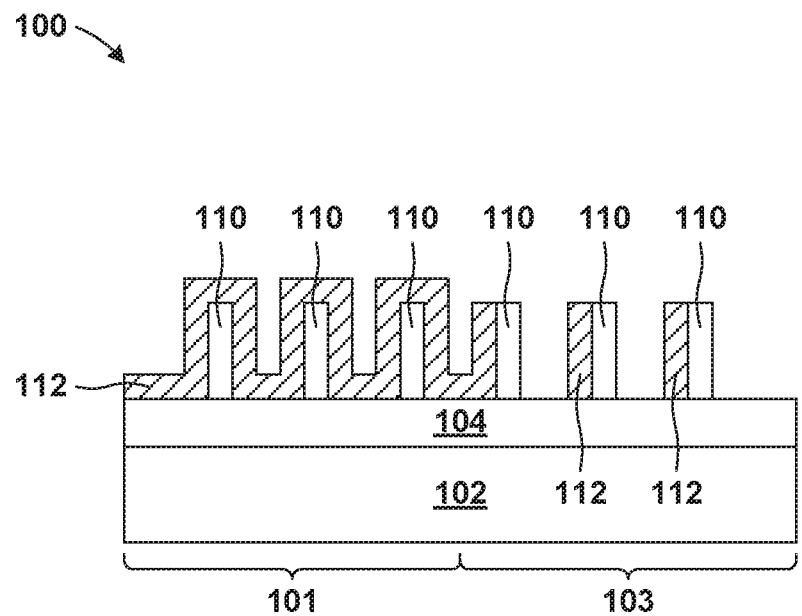

Referring now to FIGS. 6 and 7, demonstrative illustrations of a structure 100 during an intermediate step of a method of fabricating III-V fins and IV fins having a similar fin pitch and on a shared surface are provided, according to an exemplary embodiment. More specifically, the method can include removing the spacer layer 112 from a top surface and a side surface of the IV fins 110 in the nFET region 103.

First, a mask 113 may be formed on the IV fins 110 in the pFET region 101 using any deposition and patterning technique known in the art, such as, for example, photolithography. The mask 113 may be any masking material known in the art, such as, for example, oxide, nitride, or oxynitrides.

Next, a portion of the spacer layer 112 may be removed from the top surface and the side surface of the IV fins 110 in the nFET region 103 by exposing the top surface and the side surface to an angled removal process 150. A protected surface of the IV fins 110 may be a side opposite the side surface of the IV fins 110 in the nFET region 103 exposed to the angled removal process 150. The angled removal process 150 may be any angled removal process known in the art, such as, for example, an angled ion implantation (damaging the spacer layer 112 on the top surface and the side surface of the IV fins 110 in the nFET region 103 and not damaging the spacer layer 112 on the protected surface) and a wet etch (removing the damaged spacer layer 112) or an angled etch (e.g., gas cluster ion beam). The angled removal process 150 may expose a portion of the IV fins 110 on the top surface and the side surface of the IV fins 110 in the nFET region 103 (i.e., remove a covering portion of the spacer layer 112 from above the IV fins 110 in the nFET region 103). The spacer layer 112 may remain on the protected surface of the IV fins 110 in the nFET region 103. The mask 113 may be removed using any mask removal technique as is known in the art.

In an embodiment, a possible ion implantation for performing damage to the spacer layer 112 is Xenon ions at 5 keV to a concentration of $3\times10^{14}/cm^2$ at an angle of 30°. More generally, it is preferred to use relatively massive ions both as a matter of delivering a suitable level of kinetic energy to target materials and damaging the targeted materials to cause the materials to etch more rapidly. The ion implantation angle chosen should also assure the implantation into the entire height of the spacer layer 112 and may need to be adjusted if the IV fins 110 are formed in particularly close proximity to each other. Depending on the thickness of the spacer layer 112, the implant dose can range from $2\times10^{13}/cm^2$ to $2\times10^{15}/cm^2$, the implant energy can range from about 0.5 KeV to about 100 KeV and the implant angle can range from 15° to 75°. Once the spacer layer 112 is damaged, a removal step may be performed to remove the damaged spacer layer 112 using any technique known in the art, such as, for example, a wet etch containing a solution of hydrofluoric acid as the etchant.

Figure 8:
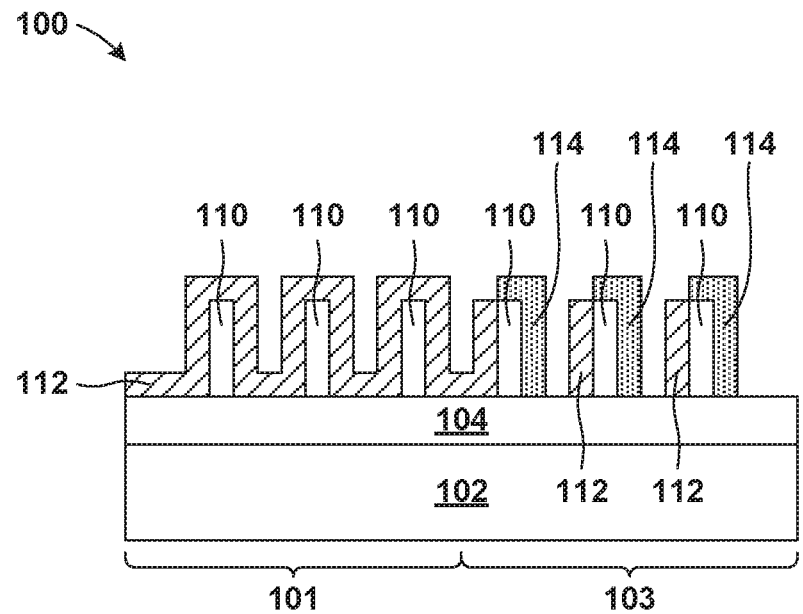
FIGS. 8 and 9 are cross section views of the semiconductor structure and illustrate the formation of III-V fins on the top surface and the side surface of the IV fins in the nFET region.
Figure 9:
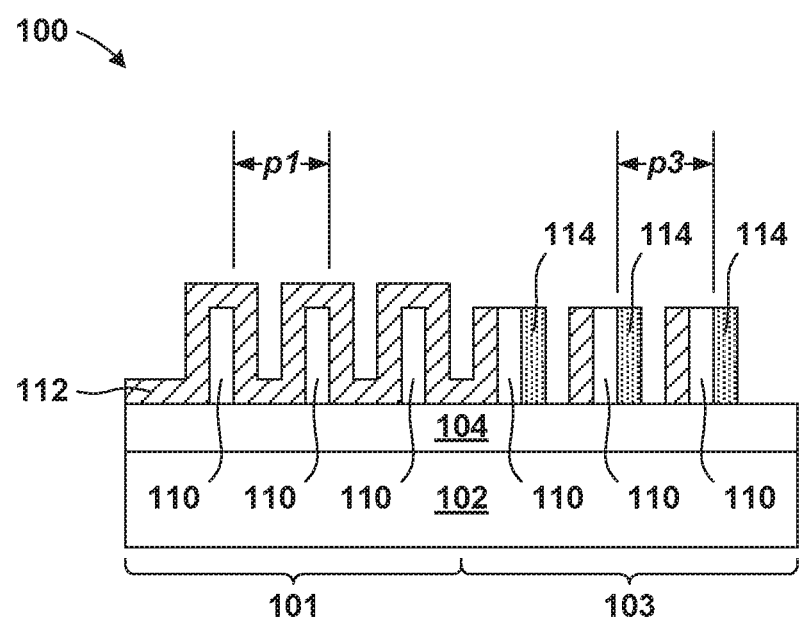

Referring now to FIGS. 8 and 9, demonstrative illustrations of a structure 100 during an intermediate step of a method of fabricating III-V fins and IV fins having a similar fin pitch and on a shared surface are provided, according to an exemplary embodiment. More specifically, the method can include forming the III-V fins 114 on the exposed portion of the IV fins 110 in the nFET region 103.

The III-V fins 114 may be formed on the exposed portions of the IV fins 110 using any technique known in the art, such as, for example, epitaxial growth. The epitaxial growth of the III-V fins 114 may use the IV fins 110 as a seed layer. The spacer layer 112 may protect against the growth of III-V fins 114 on the IV fins 110 in the pFET region 101 and the protected surface of the IV fins 110 in the nFET region 103. The III-V fins 114 may directly contact the buried insulator layer 104; the III-V fins 114 and the IV fins 110 may share a bottom surface coplanar with a top surface of the buried insulator layer 104. If the III-V fins 114 form on the top surface of the IV fins 110, the III-V fins 114 may be removed from the top surface of the IV fins 110 using any removal technique known in the art, such as, for example, reactive ion etch (RIE) or any chemical mechanical polishing. The III-V fins 114 may be etched or polished to have a top surface coplanar with the top surface of the IV fins 110. In an embodiment, the III-V fins 114 may be removed from the top surface of the IV fins 110 in the nFET region 103 using RIE, where the spacer layer 112 remains on the top surface of the IV fins 110 in the pFET region 101. In an alternative embodiment, the III-V fins 114 may be polished and the spacer layer 112 may be removed from the top surface of the IV fins 110 in both the pFET and nFET regions 101, 103, this may subsequently require another masking step to protect the IV fins 110 in the pFET region 101 during subsequent processing steps.

The III-V fins 114 may have a similar thickness to the IV fins 110 (e.g., ranging from about 5 nm to about 100 nm). The III-V fins 114 may have a third pitch (p3) between any adjacent III-V fins 114. The third pitch (p3) may be similar to the first pitch (p1).

Figure 10:
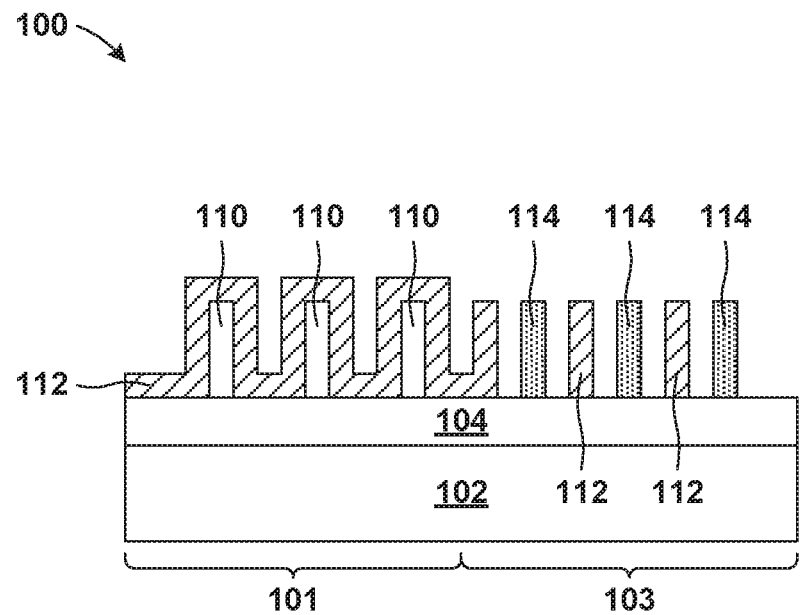
FIGS. 10 and 11 are cross section views of the semiconductor structure and illustrate the removal of the IV fins from the nFET region and the spacer layer from the nFET region and a pFET region.
Figure 11:
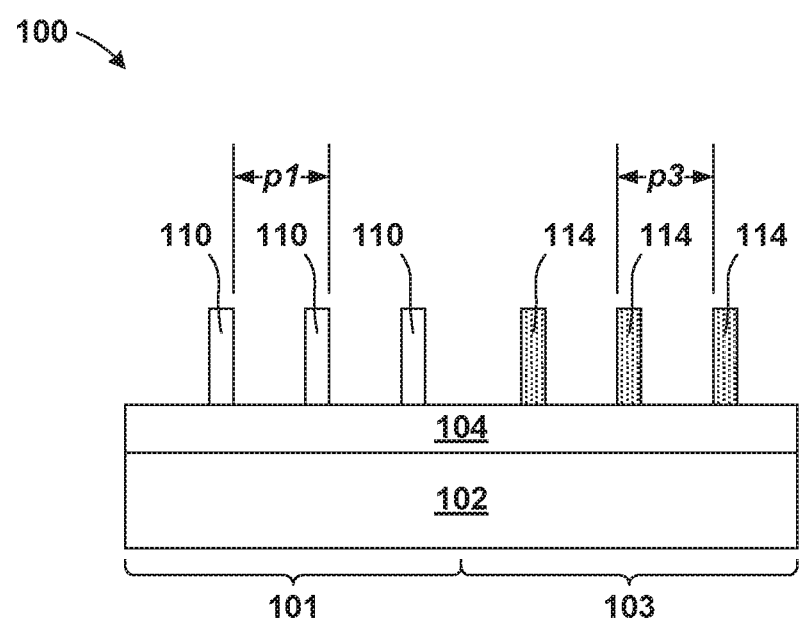

Referring now to FIGS. 10 and 11, demonstrative illustrations of a structure 100 during an intermediate step of a method of fabricating III-V fins and IV fins having a similar fin pitch and on a shared surface are provided, according to an exemplary embodiment. More specifically, the method can include removing the IV fins 110 from the nFET region 103 and removing the spacer layer 112 from both the pFET and nFET regions 101, 103.

The spacer layer 112 may cover the IV fins 110 in the pFET region 101, where the top surface of the IV fins 110 in the nFET region 103 are exposed. First, the IV fins 110 in the nFET region 103 may be removed using any etching technique known in the art, such as, for example, RIE selective to the spacer layer 112, the III-V fins 114, and the buried insulator layer 104. In other words, the IV fins 110 in the nFET region 103 may be etched, where the spacer layer 112 and the III-V fins 114 are used as masks, and the buried insulator layer 104 is used as an etch stop. Next, the spacer layer 112 may be removed from both the pFET and nFET regions 101, 103 using any etching technique known in the art, such as, for example, RIE selective to the III-V fins 114 and the buried insulator layer 104.

After the IV fins 110 are removed from the nFET region 103 and the spacer layer 112 is removed from both the pFET and nFET regions 101, 103; a set of IV fins 110 may remain in the pFET region 101 and a set of III-V fins 114 may remain in the nFET region 103. The third pitch (p3) may be equal to the first pitch (p1). The bottom surface of the III-V fins 114 may be coplanar with the bottom surface of the IV fins 110, and both the III-V fins 114 and the IV fins 110 may be directly on the shared surface (e.g., the top surface of the buried insulator layer 104). Circuit designers may prefer to follow a design rule for adjacent nFET and pFET regions (e.g., nFET fins and pFET fins having a similar thickness and pitch), as is known in the art. A benefit may include reducing cost and processing time by forming the III-V fins 114 with a thickness less than the critical thickness described above. The embodiment may avoid long growth times used in deep trench growth (i.e. aspect ratio trench growth), which may also avoids the defects that come with such growth.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a set of first fins in a pFET region and a set of second fins in an nFET region, the first fins and the second fins are on a buried insulator layer, the first fins have a bottom surface coplanar with a bottom surface of the second fins, the first fins have a first pitch between adjacent first fins that is equal to a second pitch between adjacent second fins, the first fins include a group IV semiconductor material, the second fins include a group III-V semiconductor material.

2. The structure of claim 1, wherein the bottom surface of the first fins and the bottom surface of the second fins are coplanar with a top surface of the buried insulator layer.

3. The structure of claim 1, wherein the first fins include germanium.

4. The structure of claim 1, wherein a thickness of the second fins is equal to a thickness of the first fins.

5. The structure of claim 1, wherein a thickness of the first fins is below a critical thickness of the group IV semiconductor material included in the first fins.

6. The structure of claim 1, wherein a shortest distance between a first fin and a second fin is not equal to the first pitch.

* * * * *